United States Patent
Posner et al.

(10) Patent No.: US 6,531,918 B1
(45) Date of Patent: Mar. 11, 2003

(54) LOW COST, PILOTLESS, FEED FORWARD COMPENSATION FOR A POWER AMPLIFIER

(75) Inventors: Richard D. Posner, Woodland Hills; Charles R. Gentzler, Thousand Oaks; Kwang Kim, Northridge; Do B. Shin, Laguna Hills, all of CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 0 days.

(21) Appl. No.: 09/189,642

(22) Filed: Nov. 10, 1998

(51) Int. Cl.[7] .................................................. H03F 1/26
(52) U.S. Cl. ......................................... 330/151; 330/149
(58) Field of Search ................................ 330/129, 136, 330/149, 151

(56) References Cited

U.S. PATENT DOCUMENTS

| | | | | |
|---|---|---|---|---|
| 5,493,252 A | * | 2/1996 | Takai ........................... 330/52 |
| 5,594,385 A | * | 1/1997 | Anvari ........................ 330/149 |
| 5,619,168 A | * | 4/1997 | Myer .......................... 330/149 |
| 5,694,036 A | * | 12/1997 | Myer .......................... 324/73.1 |
| 5,867,064 A | * | 2/1999 | Van Horn et al. .......... 330/149 |
| 5,877,653 A | * | 3/1999 | Kim et al. ............... 330/151 X |
| 5,977,825 A | * | 11/1999 | Mueck ........................ 330/151 |

* cited by examiner

*Primary Examiner*—Steven J. Mottola
(74) *Attorney, Agent, or Firm*—Hale and Dorr LLP

(57) ABSTRACT

The invention relates to a low cost feed forward RF power amplifier arrangement for amplifying an RF input signal using a main power amplifier operating as a class A/B amplifier. The method and apparatus modify the input signal to the main amplifier to compensate for the distortion added by the main power amplifier. The circuit provides for injecting a delayed version of the input signal, through a fixed gain-phase circuity, at a point whereby the resulting signal is amplified by the error amplifier of the second loop. A digitally controlled processor iteratively modifies various phase and gain controls to adjust the output of the amplifier. Different gain and phase control lines are iteratively updated at different rates.

8 Claims, 2 Drawing Sheets

LOW COST, PILOTLESS, FEED FORWARD COMPENSATION FOR A POWER AMPLIFIER

BACKGROUND OF THE INVENTION

The invention relates generally to power amplifiers, and in particular to linearizing the input/output transfer function for amplifiers, particularly high power class AB power amplifiers.

High power, broad band power amplifiers are well known. These amplifiers may operate in a feed forward configuration, or may have other forms of linearization which are required when the main power amplifier operates, for example, as a class AB amplifier. Although class A amplifiers usually produce less distortion than class AB amplifiers, class A amplifiers are also less efficient than class AB amplifiers. Thus, in order to retain the advantages of efficiency while minimizing distortion, class AB amplifier configurations have been developed which implement various forms of error or distortion correction.

One form of error correction uses an injected pilot signal to correct distortions in the input signal caused by the class AB amplifier. In another error correction approach, a predistortion circuit in a first loop, using, for example, a gain-phase circuit, can be provided with various adjustments to produce a gain-phase signal from the original signal, so that when the gain-phase signal is input to the power amplifier, operating as a class AB amplifier, the output is a corrected amplification of the original input signal to the amplifier arrangement.

Often predistortion circuities can be complex and employ a low power amplifier, preferably having the same general distortion characteristics as the main amplifier, so that its output, properly processed, can be used to obtain a predistorted input to the main amplifier. Such configurations operate to substantially reduce the intermodulation frequency distortions produced by a class AB amplifier when the variable elements of the predistortion circuitry are properly adjusted, but are somewhat expensive to implement.

Even in a properly adjusted amplifier arrangement using predistortion, a certain amount of instability can be observed. As a result, a second loop, using an error amplifier is employed and is tuned using, for example, the pilot signal noted above. While these remaining distortions can be attended to in the feed forward cancellation loop circuitry, for example, the pilot signal detection and cancellation circuitry is again somewhat expensive.

The invention provides an advantageous approach toward maintaining an adequately linear input/output relationship in a high power class AB power amplifier arrangement using a pilotless, low cost approach requiring fewer components and able to adjust, within limits, drift and other parameter changes in the circuit.

SUMMARY OF THE INVENTION

The invention relates to a high power, pilotless, feed forward RF amplifier featuring a first loop having an adjustment circuit (for example, a gain-phase circuit) connected to receive an input signal, a high power main amplifier operating in a non-linear operating range for amplifying the output of the adjustment circuit, a delay element coupled to the received signal, and a combiner for differencing the output of the delay element and an output of the amplifier for producing an error signal. The RF amplifier has a second loop having a second delay element coupled to the output of the amplifier, a variable gain-phase circuitry coupled to the combiner output, an error amplifier coupled to the output of the gain-phase circuitry, and a coupler for adding the output of the error amplifier to the output of the second delay element. The amplifier further features a by-pass gain-phase circuit coupled to the received input signal for injecting a gain-phase modified input signal for amplification by the error amplifier, and a controller circuitry for adjusting at least the variable gain-phase circuitry and the adjustment circuitry for obtaining a reduction in distortion energy in the output signal. Preferably, to maintain low cost, the by-pass circuit is not readjusted after it is set-up.

In another aspect of the invention, a high-frequency pilotless feed forward RF amplifier features a first loop receiving an input signal to be amplified and having a main amplifier which operates in a mode which produces an amplified signal having distortion components, a second loop coupled to the output of the main amplifier and to a delayed version of the input signal, and having an error amplifier for producing a distortion cancelling signal, and a by-pass injection circuitry for injecting a gain-phase modified version of the input signal into the second loop for amplification by the error amplifier.

In yet another aspect of the invention, a pilotless, high-power amplification method features amplifying a gain-phase modified input signal in a main power amplifier which has distortion components in its amplified output signal, compensating the distorted output of the power amplifier using a feed forward compensation circuit having an error amplifier, injecting a gain-phase modified version of the input signal from a first loop into a second loop for amplification by the error amplifier, and adjusting the signal input to the main amplifier and the error amplifier for reducing distortion in a combined output signal.

BRIEF DESCRIPTION OF THE DRAWINGS

Other objects, features, and advantages of the invention will be apparent from the following description, taken together with the drawings in which.

DESCRIPTION OF THE PREFERRED EMBODIMENTS

Figure 1:
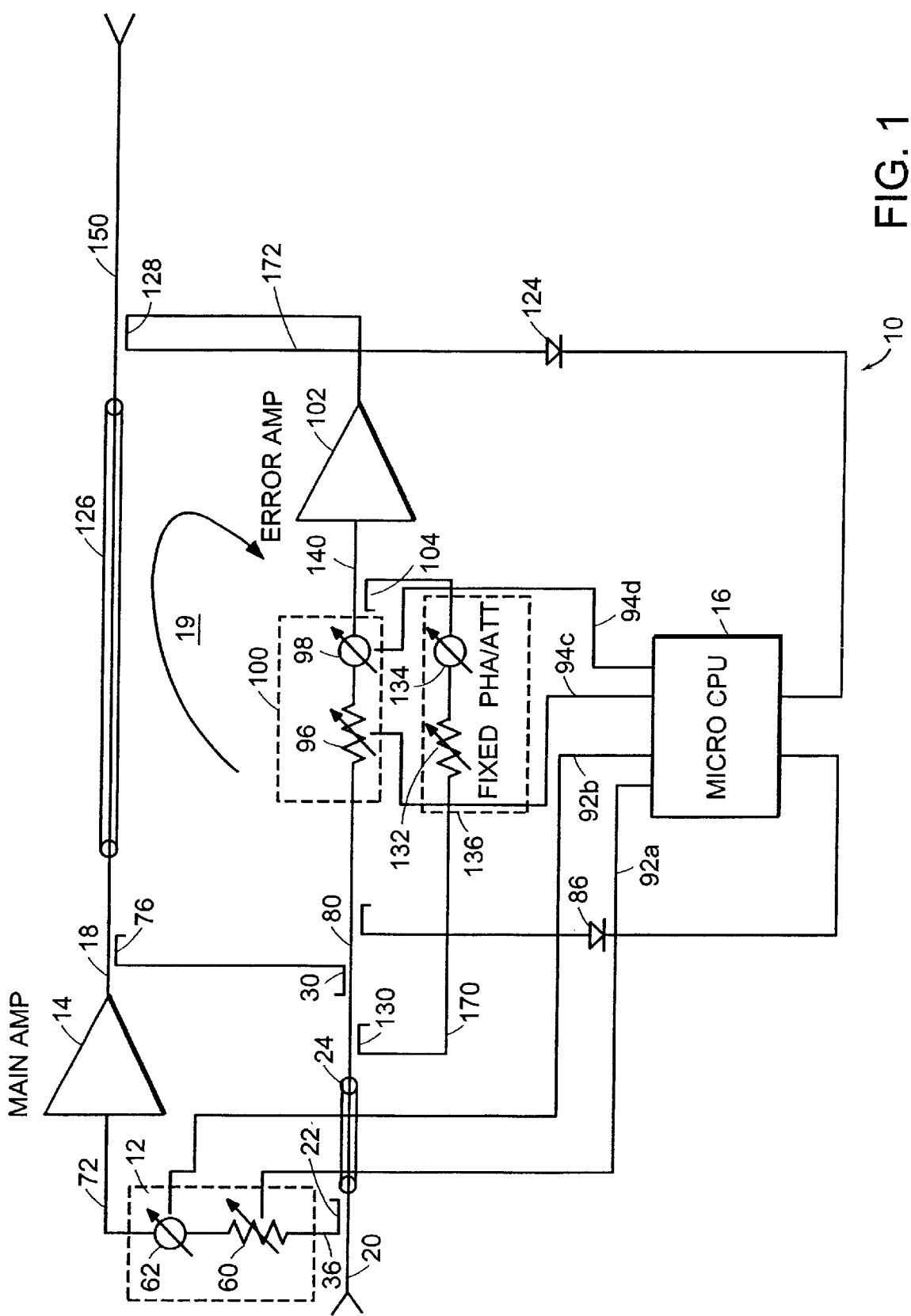
FIG. 1 is a schematic block diagram of a preferred embodiment of the amplifier and control circuitry in accordance with the invention.

Referring to FIG. 1, an amplifier arrangement 10 has a predistortion gain-phase circuitry 12, a main power amplifier 14, and a delay element 24 in a first loop. Amplifier 14 is typically a high power class AB amplifier whose output over a line 18 is the input to a feed forward second loop circuitry 19.

The input to the amplifier arrangement, over a line 20, is split (or sampled) by a line sampling coupler 22 which directs part of the input signal to the delay element 24. The output of the delay element is passed to a comparison device 30.

The remaining input signal energy from sampler 22, over a line 36, is received by a controlled gain-phase circuit 12, in the illustrated embodiment of the invention, the output of which is directed to main power amplifier 14, Amplifier 14 is operating as a Class AB amplifier.

The output of the main power amplifier 14, over line 18, is sampled by a coupler 76 and the sampled output signal is compared (differenced) by the combiner 30 to the output of the delay 24, to generate a distortion error signal on a line 80. The delay element 24 is selected to maintain the signals in time phase as they are coupled together at coupler 30, taking into account the delays inherent in the main amplifier and the circuit 12. Thus, the delayed output of delay element 24 is delivered to the comparison circuitry 30, the output of which is a measure of the distortion products at the main amplifier output after first loop compensation has been applied. This resulting error signal is then used, in part, to control the gain circuit 12.

The distortion error signal over line 80 is detected, here using a Schottky diode 86 to measure the energy in the signal, for input to the digital processor 16. The digital processor 16 outputs, in this illustrated embodiment, digital control signals over lines 92a, 92b, 94a, and 94b to control digital to analog (D/A) converters (not shown) within the gain and phase circuitries 60, 62 and 96, 98. The analog outputs of the digital to analog converters, either within the controller 16 or the controlled circuitries, control the various gain and phase elements of the gain-phase circuit 12 and the feed-forward gain and phase circuit 100 (to be described below). (The detected energy from detector 86 is used only to control circuit 12.)

The output of the comparison combiner circuit 30, is received by the gain-phase circuit 100 (which includes gain and phase correction circuits 96 and 98). The output of circuit 100 is delivered, preferably, to a linear error amplifier 102 through a coupler 104.

The second loop 19 is controlled by the controller 16, through the detection element, here a Schottky diode 124, and an analog-to-digital converter, (not shown) of controller 16. The output of the error amplifier 102 is coupled (here added) back to a delayed output of the main amplifier 14, the delay being provided by a delay element 126. The coupler 128 also provides feedback through the Schottky diode 124 to the controller 16.

In accordance with the invention, the delayed input signal, from delay element 24, is sampled by a coupler 130 and passed through a gain-phase circuit, here a fixed gain circuit 132 and a fixed phase circuit 134, by-passing combiner 30. The output of the fixed phase-gain circuitry 136 is coupled (injected) using a coupling element 104 past the combiner 30 into the output of the controlled gain-phase circuitry 100. The combined signal over a line 140 is input to the error amplifier 102.

It is the injection of the delayed input signal, modified by the gain-phase circuit 136, into the second loop 19 which enables the initial nulling of the signal as described in more detail below.

Referring to the controller circuitry 16, the error signal output from comparison circuitry 30 is detected using the Schottky diode 86, in this illustrated embodiment of the invention, and is provided as an input to the controller 16. In essence, the Schottky diode 86 measures the energy contained in the signal applied to it and that energy signal is provided to the controller 16 (through analog to digital converters (not shown)).

The controller 16 operates on a priority basis, as described below, and based upon the measured energy inputs applied to it, continuously and iteratively outputs digital signal values to the D to A converters associated with the various circuits. The D to A converters, upon receiving a new digital signal value, convert their digital inputs to an analog signal output for controlling, in this illustrated embodiment, the gain and phase correction circuits 60, 62, and 96, 98. As these circuits vary in gain and/or phase, the effect is to linearize the input/output relationships from the input signal over line 20 to the output signal over line 18 for the first loop, and the input signal over line 20 to output signal over a line 150 for the second loop. This is performed in the first loop, as described above, by predistorting the input to the main amplifier so that the overall response at the output of the main amplifier is linear with respect to the input signal over line 20, and similarly modifying the error amplifier 102 output to reduce distortion components in the output over line 150, that is, to cancel the distortion components in the main amplifier output.

Figure 2:
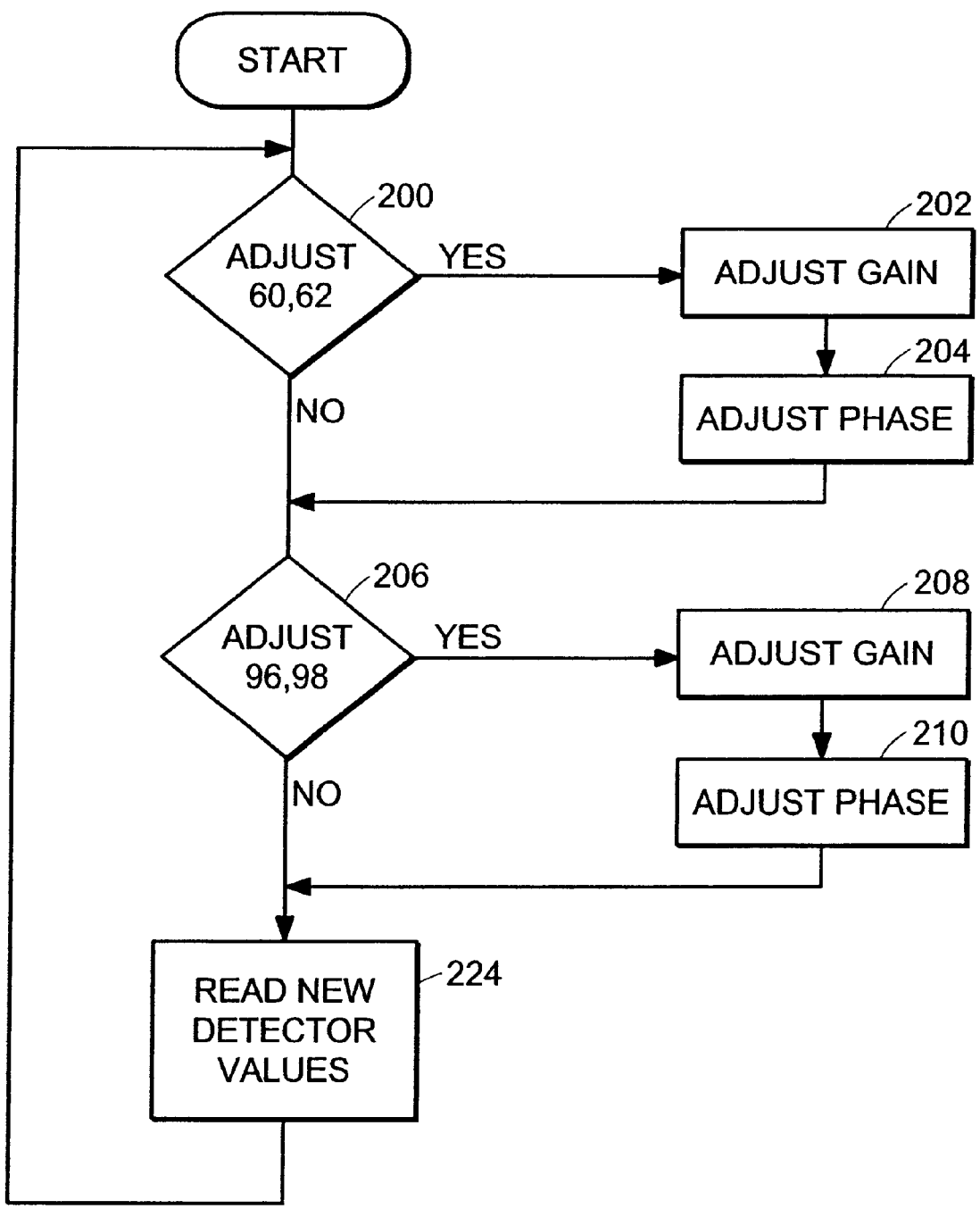
FIG. 2 is a flow chart illustrating operation of the digitally controlled amplifier processor in accordance with a preferred embodiment of the invention.

In operation, controller 16 operates substantially in a feedback loop environment. That is, it iteratively adjusts the varying control elements to which it is connected and determines whether the adjustment improves, has no effect, or renders worse, the error products such as the output of on line 18 or in the output of the overall device on line 150. The object is to minimize the distortion components at the output of linear amplifier 14 as detected by reaching a null at the output of comparator 30. In performing this process, referring to FIG. 2, the controller operates to give highest priority to the gain and phase control circuits 60, 62, which operate at approximately a millisecond cycle time as opposed to a lower priority in controlling the operation of gain and phase correction circuities 96 and 98 which are updated approximately every three to four milliseconds. The control processor can be, for example, a model MC68HC11E9 processor, manufactured by Motorola.

Accordingly, in operation, controller 16 loops between the various correction circuities in order to continuously maintain and update the correction output values. Thus, once started (referring to FIG. 2) the system first checks whether to adjust gain and phase correction circuits 60, 62. This decision can be based, for example, upon an internal clock measurement so that these elements can be updated every millisecond. This is tested at step 200. If the elements are to be adjusted, then the gain can be adjusted at step 202 and the phase can be adjusted at step 204, after which control returns to the main loop. Thereafter, the system determines whether to adjust the control voltages to gain-phase circuit 100 and in particular to gain circuitry 96 and phase circuitry 98. If, the decision at step 206 is "yes", the control signals to each of the these elements are adjusted in sequence at steps 208 and 210. Control then again returns to the main loop. The next step reads new detector values at the inputs from detection elements 86 and 124. This is indicated at step 224. In accordance with the invention, the delayed portion of the input signal over line 20 is coupled using comparison coupler 30 as an input over line 170 to the gain-phase circuity 136. The output of the gain-phase circuity 136 is added to the output of the gain phase circuity 100 and appears as an input, over line 140, to the error amplifier. The output of the error amplifier is coupled using coupler 128 to the output of the delay element 126 and a portion of the combined energy is also available over line 172 for measurement and detection using Schottky diode 124.

In operation, a user or technician measures the energy detected at the output of Schottky diode 124 and adjusts the gain and phase of gain-phase circuity 136 to minimize that detected energy. The gain-phase elements 132 and 134 are, preferably, highly stable over time in view of temperature and other environmental changes. By adjusting the gain and phase of elements 132, 134, and these adjustments can be made either automatically or manually, the system injects a version of the input signal, appropriately delayed, into the input to the error amplifier. The output of the error amplifier, when coupled to the output of delay element 126, thus provides a mechanism for ensuring that the distortion components are minimized at initial setup. The injection of the derived input signal at coupler 104 thus operates, in accordance with the invention, as a "pilot" signal which is then detected, effectively, by the detection mechanism 124. In this embodiment, since the injected signal has a large dynamic range, the dynamic range of the error amplifier will be substantially greater, for example 20–30 dB's greater than the range of the error amplifier when used solely for amplifying the gain and phase elements 96 and 98.

After the "fixed" gain and phase element 132, 134 respectively, have been set, the system automatically, as noted above, adjusts the other gain/phase circuits to reduce and minimize the distortion energy detected by measurements of measuring devices 86 and 124. It should be clear, however, that other measurement apparatus and controls can be implemented. Further, implementations of the disclosed invention may include automatic variation of the gain-phase circuity 136 by controller 16, the use of a more sophisticated distortion compensation circuitry before the main amplifier, such as that disclosed in U.S. patent application Ser. No. 09/057,332, filed Apr. 8, 1998, and entitled DYNAMIC PREDISTORTION COMPENSATION FOR A POWER AMPLIFIER, the contents of which is incorporated herein by reference, and additional circuitry in the second loop 19 such as is well-known in the field.

In the preferred embodiment of the invention, gain and phase correction circuitries 60 and 62 are adjusted based solely upon the error signal value from detector 86. Similarly, the gain and phase correction circuits 96 and 98 are adjusted based solely upon the detector output measurements of detector 124.

Additions, subtractions, and other modifications of the described and preferred embodiment of the invention will be apparent to those practiced in this field and are within the scope of the following claims.

What is claimed is:

1. A high power, pilotless, feed-forward RF amplifier comprising:
    a first loop comprising
        an adjustment circuit connected to receive an input signal,
        a high power amplifier operating in a non-linear operating range for amplifying an output of the adjustment circuit,
        a delay element coupled to the received input signal, and
        a combiner for differencing an output of the delay element and an output of the power amplifier for producing an error signal,
    a second loop comprising
        a second delay element coupled to the output of the power amplifier,
        a variable gain-phase circuitry coupled to the combiner output,
        an error amplifier coupled to the output of the gain-phase circuitry, and
        a coupler for adding the output of the error amplifier to the output of the second delay element, and
    a by-pass gain-phase circuit coupled to the received input signal for injecting a gain-phase modified input signal for amplification by said error amplifier, and
    a controller circuitry for adjusting at least the variable gain-phase circuitry and the adjustment circuit for obtaining a reduction in distortion energy in the output signal.

2. The amplifier of claim 1 wherein said by-pass circuit comprises
    a manually adjustable gain circuit in series connection with a manually adjustable phase circuit.

3. The amplifier of claim 1 wherein said adjustment circuit comprises
    a gain-phase circuit having an adjustable gain circuit and an adjustable phase circuit.

4. The amplifier of claim 3 wherein said controller is responsive to a detected energy measurement of the error signal and a detected energy measurement of the output signal.

5. A high power, pilotless, feed-forward RF amplifier comprising:
    a first loop receiving an input signal to be amplified and having a main amplifier operating in a mode which produces a signal having distortion components,
    a second loop coupled to the output of the main amplifier and to a delayed version of the input signal and having an error amplifier for producing a distortion canceling signal, and
    a by-pass injection circuitry for injecting a gain-phase modified version of the delayed version of the input signal into the second loop for amplification by said error amplifier.

6. A pilotless, high-power amplification method comprising:
    amplifying a gain-phase modified input signal in an amplifier having, in its output, distortion components,
    compensating the distorted output of the distorting amplifier using a feed-forward correction circuit having an error amplifier,
    injecting a gain-phase modified version of the input signal from a first loop into a second loop for amplification by the error amplifier,
    adjusting the signals input to the distorting amplifier and the error amplifier for reducing distortion in a combined output signal,
    said adjusting comprising:
        varying sequentially the phase and gain of the first and second loops.

7. A pilotless, high-power amplification method comprising:
    amplifying a gain-phase modified input signal in an amplifier having, in its output, distortion components,
    compensating the distorted output of the distorting amplifier using a feed-forward correction circuit having an error amplifier,
    injecting a gain-phase modified version of the input signal from a first loop into a second loop for amplification by the error amplifier,
    adjusting the signals input to the distorting amplifier and the error amplifier for reducing distortion in a combined output signal, and
    manually varying the gain and phase of the gain-phase modified version of the input signal to obtain a null in output signal energy.

8. The method of claim 7 further comprising detecting at least one measured energy from the first loop and the output signal for adjusting said main and error amplifier input signals.

* * * * *